(12) United States Patent
Mirkin et al.

(10) Patent No.: US 7,588,624 B2
(45) Date of Patent: Sep. 15, 2009

(54) METHOD OF PRODUCING GOLD NANOPRISMS

(75) Inventors: Chad A. Mirkin, Wilmette, IL (US); Jill E. Millstone, Jacksonville, FL (US); Sungho Park, Evanston, IL (US); Gabriella Metraux, Evanston, IL (US)

(73) Assignee: Northwestern University, Evanston, IL (US)

( * ) Notice: Subject to any disclaimer, the term of this patent is extended or adjusted under 35 U.S.C. 154(b) by 378 days.

(21) Appl. No.: 11/372,687

(22) Filed: Mar. 10, 2006

(65) Prior Publication Data

US 2006/0207388 A1 Sep. 21, 2006

Related U.S. Application Data

(60) Provisional application No. 60/660,359, filed on Mar. 10, 2005, provisional application No. 60/742,194, filed on Dec. 2, 2005.

(51) Int. Cl.
*B22F 9/00* (2006.01)
*C21B 15/04* (2006.01)
*C22B 5/20* (2006.01)
*C22C 1/04* (2006.01)

(52) U.S. Cl. .......................... 75/343; 75/370
(58) Field of Classification Search .............. 75/330, 75/343, 370, 371, 392, 710, 711, 721, 724, 75/732, 736, 739, 741; 148/400, 430; 420/507; 423/1, 23

See application file for complete search history.

(56) References Cited

U.S. PATENT DOCUMENTS 7,252,698 B2 * 8/2007 Mirkin et al. ................ 75/255

OTHER PUBLICATIONS

Chen, Sihai et al. "Monopod, Bipod, Tripod, and Tetrapod Gold Nanocrystals," Journal of the American Chemical Society, 125, pp. 16186-16187 (2003).*
Supporting Information for Sau et al. "Room Temperature, High-Yield Synthesis of Multiple Shapes of Gold Nanoparticles in Aqueous Solution," Journal of the American Chemical Society, vol. 126, No. 28 (2004) pp. 8648-8649.*
Gao, Jinxin; Bender, Christopher M.; Murphy, Catherine J.; "Dependence of the Gold Nanorod Aspect Ratio on the Nature of the Directing Surfactant in Aqueous Solution," Langmuir (2003) 19, pp. 9065-9070.*
Lynch et al., *Handbook of Optical Constants of Solids*, ed. Palik, E.D., (New York:Academic Press) p. 275 (1985).
Mosseri et al., *J. Phys. Chem.*, 93:6791 (1989).
Murphy et al., *J. Am. Chem. Soc.*, 126:8648 (2004).
Natan et al., *Chem. Mater.*, 12:306 (2000).
Theye, *Phys. Rev. B*, 2:3060 (1970).
Anonymous: Internet Article, [Online] Sep. 9, 2004, p. 1, XP002391163, Retrieved from the Internet: URL:http://chem.sis.nlm.nih.gov/chemidplus/jsp/common/PhysicalProperties.jsp> [retrieved Jul. 19. 2006].

(Continued)

*Primary Examiner*—George Wyszomierski
*Assistant Examiner*—Vanessa Velasquez
(74) *Attorney, Agent, or Firm*—Marshall, Gerstein & Borun LLP

(57) ABSTRACT

The present invention relates to a method of producing gold nanoprisms. In particular, gold nanoprisms having uniform shapes and edge lengths and thickness are produced utilizing a three step growth process.

16 Claims, 11 Drawing Sheets

OTHER PUBLICATIONS

Gole et al., *Chemistry of Materials,* 16(20):3633-3640 (2004).
Jana et al., *J. Phys. Chem. B.,* 105(19):4065-4067 (2001).
Pei et al., Meeting Abstracts; 2004 Joint International Meeting—206th Meeting of the Electrochemical Society/2004 Fall Meeting of the Electrochemical Society of Japan, MA, p. 231 (2004).
Sau et al., *J. Am. Chem. Soc.,* 126(28):8648-8649 (2004).
Written Opinion of the International Searching Authority, International application No. PCT/US2006/008930.

* cited by examiner

METHOD OF PRODUCING GOLD NANOPRISMS

CROSS-REFERENCE TO RELATED APPLICATIONS

This application claims the benefit of U.S. Provisional Application Ser. No. 60/660,359, filed Mar. 10, 2005, and U.S. Provisional Application Ser. No. 60/742,194, filed Dec. 2, 2005.

STATEMENT OF GOVERNMENTAL INTERESTS

This invention was made with government support under National Science Foundation grant No. EEC-0118025 and Office of Naval Research grant No. 00014-03-1-0800. The government has certain rights in this invention.

FIELD OF THE INVENTION

The use of nanostructured materials in applications such as biodetection, catalysis, and electronics has led to an explosion in research directed to developing synthetic methods for preparing such nanostructures. The majority of effort has focused on isotropic, pseudo-spherical structures, but recently researchers have made promising advances in controlling architectural parameters, such as particle size, shape, and composition. These architectural parameters dictate the physical and chemical properties of a nanostructure.

Triangular nanoprisms, in particular, are a class of nanostructures that have generated intense interest due to their unusual optical properties, and to the recent development of methods for preparing bulk quantities of triangular nanoprisms. Depending upon composition and desired dimensions, particular types of nanoprisms can be prepared either thermally or photochemically. The photochemical routes, thus far, have been used to synthesize silver nanoprisms with excellent size control. Gold nanoprisms, on the other hand, have been synthesized exclusively by thermal methods with varying degrees of success regarding purity and size control. Methods of forming gold particles have mostly resulted in a structures of high diversity of shape and size. The optical properties of gold nanoparticles, and particularly nanoprisms, are enhanced when the nanoparticles are uniform in shape and size. Both gold and silver prism compositions are particularly attractive for their enhancing properties with respect to Raman spectroscopy.

The optical spectra of gold nanoprisms should exhibit a distinct dipole plasmon resonance, as observed in isotropic spherical structures, in addition to weaker higher order plasmon resonances, as evidenced by their identification in lithographically patterned analogues. In the case of silver, where bulk preparations of highly uniform and relatively pure nanoprisms can be realized, these plasmon resonances have been identified and assigned through experiment and computation. A quadrupole resonance for colloidal solutions of gold nanoprisms has not been experimentally identified.

The identification of higher order surface plasmon resonance modes associated with various metal nanoparticles, in addition to silver, is important because it provides greater understanding of their physical properties, as well as a spectroscopic fingerprint to characterize and assess the purity or properties of such structures. It would be desirable to develop a method that reliably and consistently provides uniform or essentially uniform gold and other metal nanoprisms in high yield, for uses currently limited to silver nanoprisms.

SUMMARY OF THE INVENTION

The present invention relates to methods of forming gold nanoparticles. In particular, the present invention provides methods for forming gold nanoparticles having triangular or spherical morphologies, of high purity and uniform shapes and dimensions.

Therefore, one aspect of the present invention is to provide a method of producing gold nanoparticles, in particular, triangular gold nanoprisms, with uniform edge lengths and thicknesses. Accordingly, the present invention provides a synthetic approach, and a separation procedure, for preparing and isolating useful quantities of gold nanoparticles having uniform edge lengths and thicknesses, which for the first time permits the use of ultraviolet (UV)-visible (Vis)-near infrared (NIR) spectroscopy to observe an in-plane quadrupole resonance mode of gold nanoprism triangular structures.

Another aspect of the present invention is to provide a method of maintaining the shape and increasing the edge length of gold nanoprisms by adding a solution of a gold salt and a reducing agent to a gold nanoprisms suspension. In some embodiments, the solution of a gold salt and reducing agent is added a plurality of times.

Another aspect of the present invention is to provide a method of monitoring the formation of gold nanoprisms. Accordingly, the present invention provides a monitoring method for observing growth of nanoprisms through measurements of a quadrupole resonance mode of the growing nanoprisms. The quadrupole resonance mode directly correlates to the edge length of the nanoprisms.

DETAILED DESCRIPTION OF THE PREFERRED EMBODIMENTS

Figure 1:
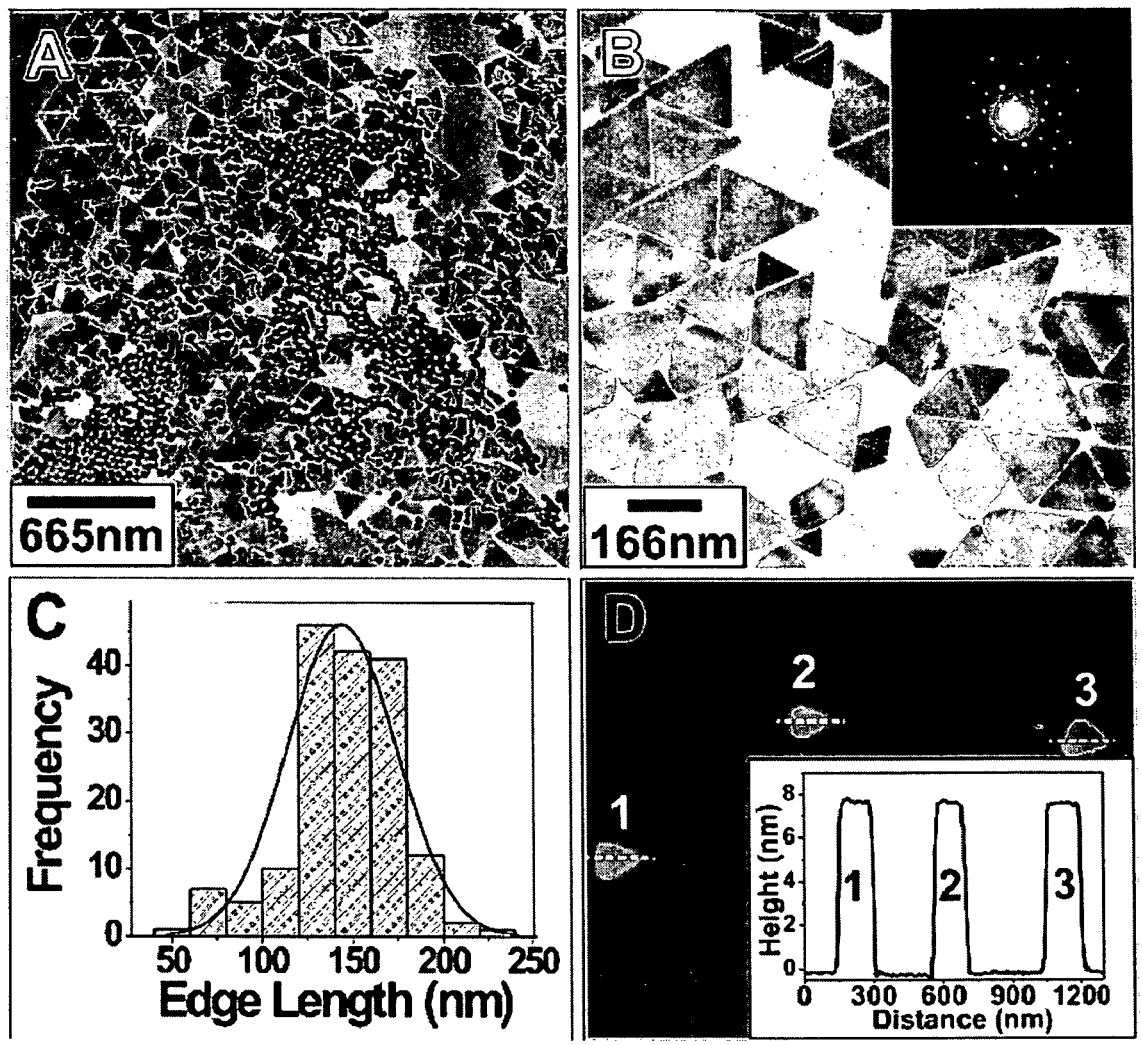
FIG. 1A is a transmission electron microscope (TEM) image of spherical and triangular gold nanoparticles produced in accordance with the present method.
FIG. 1B is an enlarged image of FIG. 1A, wherein the inset shows an electron diffraction pattern of the top of a single prism.
FIG. 1C is a histogram of the edge lengths of nanoprisms produced in accordance with the present method
FIG. 1D is an atomic force microscope (AFM) image of the nanoprisms of FIG. 1A on mica, using a tapping mode procedure, wherein the inset shows the height profile along the dotted lines.

The present invention is directed to a synthetic procedure that provides gold nanoparticles, in particular, triangular gold nanoprisms, of consistent and uniform shape and dimensions. The present method involves the use of small gold seed nanoparticles having a diameter of about 3 nm to about 10 nm, and typically about 4.5 to about 6 nm. The nanoprisms are synthesized using a three step growth of gold seed nanoparticles suspended in an aqueous medium and growth solutions containing (a) a surfactant, such as cetyltrimethylammonium bromide (CTAB); (b) gold ions from a gold salt, such as gold(III) chloride ($HAuCl_4$); (c) a reducing agent, such as ascorbic acid; and (d) a base, such as sodium hydroxide. The surfactant is present in each growth solution at a concentration of at least 80% saturated, as measured at 25° C.

The synthetic method used in this invention is based on the seed-mediated growth process first disclosed by Natan et al. (*Chem Mat* 12:306 (2000)) for the production of homogeneous gold nanoparticles. The method was later used to produce anisotropic gold nanostructures (Murphy et al., *J Am Chem Soc* 126:8648 (2004)). The present method differs from both prior methods and produces triangular nanoprisms and spherical nanoparticles, having uniform shape and size distribution which are free or essentially free of rod, cubes, and branched structures. The spherical nanoparticles can be separated from the triangular nanoprisms, generating high purity gold nanoprisms and allowing better access to the optical applications of gold nanoprisms.

As used herein, "nanoparticle" refers to small structures that are less than 10 µm, and preferably less than 5 µm, in any one dimension. "Nanoprisms" are nanoparticles that have prism-like properties.

The present method comprises a three step process for forming gold nanoprisms. Gold nanoparticles for seeding are required. These nanoparticles can be made via known methods, for example, as described in Murphy et al., *J Am Chem Soc* 126:8648 (2004), and typically have a diameter of about 3 nm to about 10 nm. The seed nanoparticles are suspended in an aqueous medium for ease of handling. These small seed nanoparticles then are added to the first of three growth solutions. A predetermined amount of the gold seed nanoparticle suspension is admixed with the first growth solution. Subsequently, the resulting mixture is admixed with a second growth solution to form a second mixture. Finally, the second mixture is added to a third growth solution. After a time sufficient to form the nanoprisms, the reaction is complete, and the gold nanoprisms are collected.

Growth solutions, as used herein, are solutions comprising a surfactant, a gold salt, a reducing agent, and a base. The present method includes the successive addition of a gold seed nanoparticle suspension to three growth solutions to form gold nanoprisms. The three growth solutions can contain the same or different surfactant, gold salt, reducing agent, and/or base, and the concentration of each component of each growth solution is independent from the concentration of the components of other two growth solutions. The growth solutions are prepared using polar solvents. Typically the solvent comprises water, but other solvents also can be present, including but not limited to, ethanol, methanol, dimethylformamide, dimethyl sulfoxide, and mixtures thereof.

Gold seed nanoparticle suspensions are prepared by known methods in the art, such as disclosed in Murphy et al., *J Am Chem Soc* 126:8648 (2004) and Natan et al., *Chem Mater* 12:306 (2000).

Surfactants useful in the present method include, but are not limited to, (a) ammonium salts having at least one and up to four substituents having at least four carbons and (b) alkyl pyridinium salts. Specific examples are, but are not limited to, tetrabutylammonium bromide (TBAB), dodecyldimethylammonium bromide (DDAB), cetyltrimethylammonium bromide (CTAB). The counterion of the ammonium or alkyl pyridinium salt can be acetate, halide, pivolate, glycolate, lactate, and the like. The concentration of surfactant in a growth solution typically is about 80% saturated up to 100% saturated, at 25° C. A preferred concentration of the surfactant in a growth solution is at least 90% saturated.

Gold salts for use in the disclosed method include, but are not limited to, gold(III) chloride, and derivatives, hydrates, and solvates thereof.

Bases for use in the disclosed method include, but are not limited to, sodium hydroxide, potassium hydroxide, ammonium hydroxide, magnesium hydroxide, sodium carbonate, sodium bicarbonate, and the like. A preferred base is sodium hydroxide.

Reducing agents for use in the disclosed methods include, but are not limited to, ascorbic acid, sodium borohydride, 2-mercaptoethanol, dithiothreitol (DTT), hydrazine, lithium aluminum hydride, diisobutylaluminum hydride, oxalic acid, Lindlar catalyst, sulfite compounds, stannous compounds, ferrous compounds, sodium amalgam, and the like.

The aging time, i.e., the length of time each growth solution reacts with the added mixture, can vary. The aging time of each step, independently, can be about 2 seconds to about 72 hours. In some embodiments, the aging time of each step is about 5 minutes to about 24 hours. Other aging times can be about 5 seconds to about 5 minutes, about 15 minutes to about 60 minutes, and about 2 hours to about 24 hours. The aging time of each mixture prior to addition to a subsequent growth solution is independently selected. In one embodiment, the aging times are the same for each mixture.

The volume ratio of the amount of gold seed nanoparticle suspension to the first growth solution is about 1:1 to about 1:20, preferably about 1:2 to about 1:15, and more preferably about 1:3 to about 1:10. This amount, termed the "initiating amount," is sufficient to initiate the synthesis of gold nanoprisms in the first mixture. In one embodiment, 1 mL of a gold seed nanoparticle suspension is added to 9.3 mL of a first growth solution to form a first mixture. The volume ratio of the first mixture (i.e., of gold seed nanoparticle suspension and first growth solution) admixed with the second growth solution is about 1:3 to about 1:20, preferably about 1:5 to about 1:15. In one embodiment, the volume ratio of first mixture added to the second growth solution is about 1:10. The volume ratio of the second mixture admixed with the third growth solution is about 1:3 to about 1:20, preferably about 1:5 to about 1:15. In one embodiment, the volume ratio of second mixture added to the third growth solution is about 1:10.

The molar ratio of the amount of gold salt to amount of surfactant in each growth solution is about 2:3 to about 1:25. In one embodiment, the molar ratio of gold salt to surfactant is about 1:9. The molar ratio of the amount of reducing agent to the amount of gold salt in each growth solution is about 1.01:1 to about 20:1. In one embodiment, the molar ratio of reducing agent to gold salt is about 1.5:1.

The temperature at which the method can be performed is about 20° C. to about 100° C. In one embodiment, the method is performed at about 25° C. Other temperatures include, but are not limited to, 21, 22, 23, 24, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, and 99° C.

The resulting gold nanoprisms can be further purified to separate smaller nanoparticles from nanoprisms having the desired dimensions. In one embodiment, this purification is performed by filtration. Typically, the filtration is accomplished using an aluminum oxide filter having 100 nm pores, for example (Whatman, Florham Park, N.J. USA). Other means of purification or removal of small nanoparticles from the reaction solution can be employed. A nonlimiting example includes centrifugation.

The formation of gold nanoprisms can be monitored by observation of the color change of the solution, by measurement of the UV-Vis-NIR spectrum, or by other analytical means such as AFM and TEM. The formation is typically complete after about 30 minutes, but the reaction often can take as little as about 10 minutes to a long as about 24 hours. Shorter or longer aging times, i.e., 2 minutes up to 72 hours, may be necessary to form the nanoprisms according to the present method.

The gold particles produced via the present method are spherical nanoparticles and triangular nanoprisms, are relatively homogeneous in size, and are free, or at least essentially free, of rods, cubes, and branched structures. FIG. 1A shows that nanoprisms produced using the present method are essentially free of rods, cubes, and branched structures, i.e., at least 80%, preferably 90%, and more preferably 95%, of the nanoparticles are triangular or spherical morphologies. In some embodiments, the nanoparticles consist essentially of triangular and spherical morphologies, wherein at least 98% of the structures formed are triangular or spherical.

The number of subsequent additions of growth solutions is not limited. In some embodiments, three growth solutions are employed, but more growth solutions can be used. For example, four, five, six, seven, eight, nine, and ten growth solutions can each be employed using the disclosed method to produce gold nanoparticles and, in particular, triangular gold nanoprisms of uniform shape and size.

In one embodiment, gold nanoprisms produced, for example, according to the present invention, can further be subjected to additions of growth addition solutions. These growth addition solutions consist essentially of a gold salt and a reducing agent. The molar ratio of reducing agent to gold salt is at least about 1.01:1 in the growth addition solution, and can be about 2:1 to about 15:1. In one embodiment, the molar ratio of gold salt to reducing agent in the growth addition solution is about 10:1. A growth addition solution can be added to the gold nanoprisms a plurality of times, in order to achieve a desired, or targeted, edge length. The number of additions of a growth addition solution can be about 2 to about 20, and will depend upon the final edge length desired. The time at which a growth addition solution is added to gold nanoprisms is not limited. The chemical factors controlling the growth of nanoprisms (e.g., the redox potentials controlling gold ion reduction) are not dependent upon the age of the nanoprisms. As long as the nanoprisms retain their original structure (i.e., triangular), the chemistry of reducing gold ions and increasing nanoprism edge length is relevant.

Figure 11:
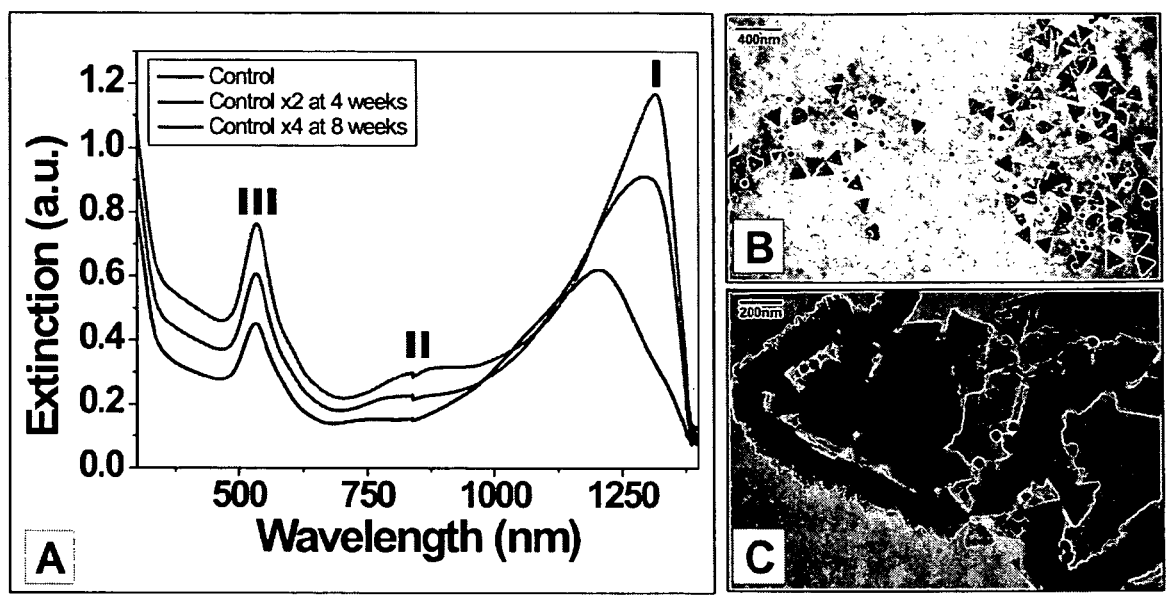
FIG. 11A is a UV-Vis-NIR spectrum of nanoprism solutions regrown 4 and 8 weeks after their initial synthesis, wherein peak I and peak II represent the dipole and quadrupole resonances of the gold nanoprisms, and peak III is the dipole resonance of the gold spherical nanoparticles.
FIG. 11B is a TEM image of nanoprisms grown at 4 weeks.
FIG. 11C is a TEM image of nanoprisms grown at 8 weeks.

In most thermal methods for anisotropic nanoparticle syntheses, the size and shape of the nanoprisms are dictated by the initial reaction conditions and have not been investigated for post-synthetic dimension control. The present method demonstrated that gold nanoprisms are still reactive and can be used as "seeds" for further growth. The edge length of nanoprisms that were 4 and 8 weeks old increased upon addition of a growth addition solution (FIG. 11). The optical spectra of nanoprism growth show that the edge length increases are dependent only on the amount of gold salt and reducing agent added, not on the age of the nanoprism solution. Compared to nanoprisms grown from "fresh" nanoprism solutions, older nanoprism solutions showed similar intensity increases as the nanoprisms grow (average about 0.0766 arbitrary units) and similar redshifts of the quadrupole and dipole plasmon resonances (31±13 nm for quadrupole) per two additions of growth addition solution.

In preferred embodiments, triangular nanoprisms produced via the present method have a narrow distribution of edge length and thickness. The histogram in FIG. 1C represents the edge-length size distribution of the nanoprisms produced using the present method. The average edge length of triangular gold nanoprisms produced using the present method is about 100 to about 400 nm. The average edge length of the nanoprisms produced was 144±30 nm. The average diameter of spherical gold nanoparticles produced according to the present method is about 25 to about 50 nm. The average spherical nanoparticle diameter was 35±2 nm.

Electron diffraction analysis of individual gold nanoprisms showed that, unlike nanoprisms formed using lithography, nanoprisms formed using the present method are single crystalline, and the large top and bottom faces are <111> facets (see FIG. 1B). Atomic force microscopy (AFM) images of the gold nanoprisms confirmed that their top and bottom faces are atomically flat with a uniform thickness of about 7.8±0.5 nm. Prism thickness was approximately equal to the average diameter of the seed nanoparticles when the thickness of two layers of CTAB (i.e., on the top and bottom surfaces of each nanoprism) is taken into account. This observation suggests that growth of the prisms occurs in two dimensions from the isotropic seed nanoparticles to form anisotropic nanoprisms.

Figure 2:
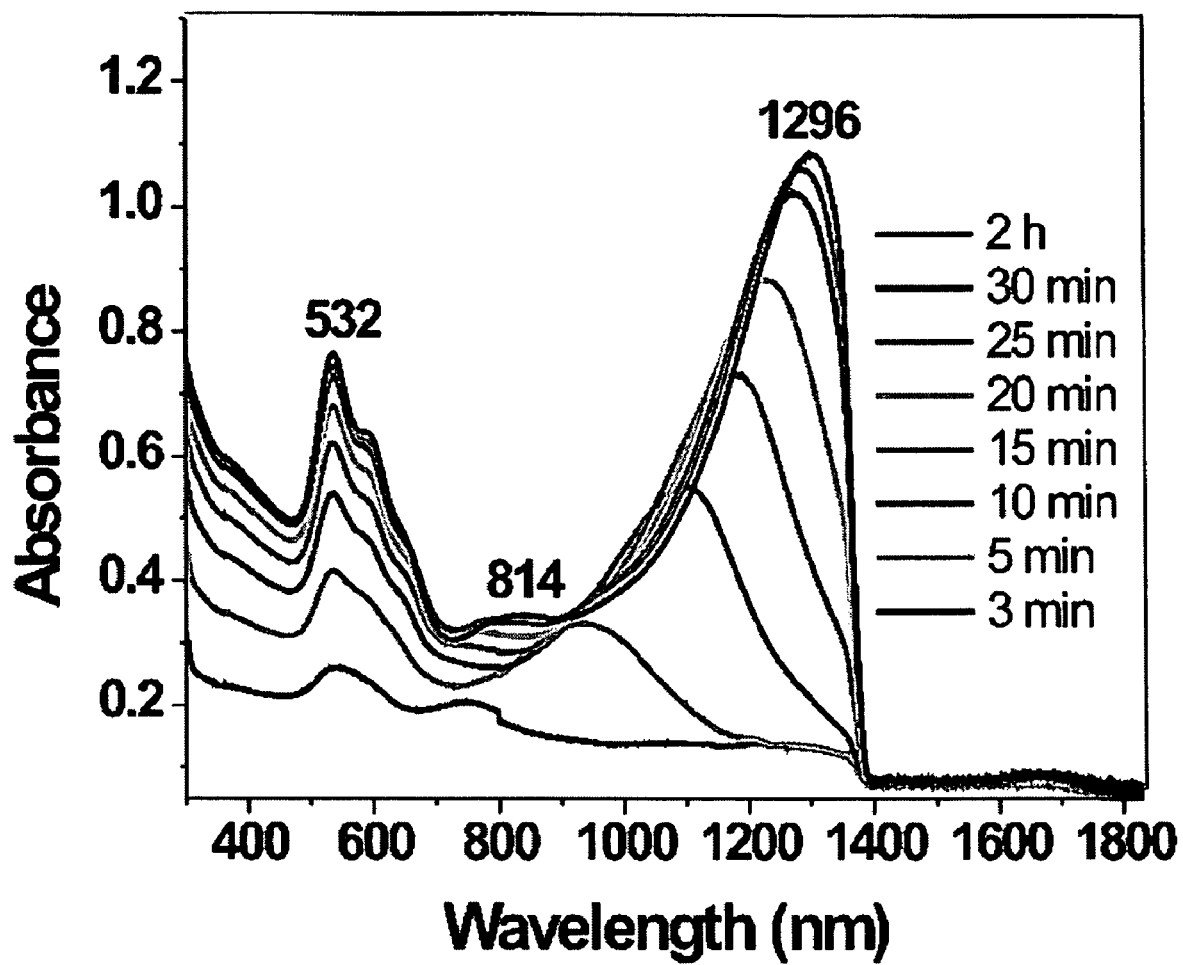
FIG. 2 is a plot of Absorbance vs. Wavelength (nm) of in situ UV-Vis-NIR spectra monitoring the formation of gold nanoprisms after gold seed nanoparticle addition, wherein increased time correspond to an increase absorbance at 532 and 1296 nm.

The nanoprism growth process can be monitored in real time by UV-Vis-NIR spectroscopy (FIG. 2). The spectra reveal two distinct bands, the first of which at 532 nm indicated the presence of spherical particles (35±2 nm, FIG. 1A). The position of this band did not change significantly with time. The band was assigned to the dipole plasmon resonance associated with the spherical gold nanoparticles and its intensity correlated to the concentration of gold nanoparticles in solution. A second band was observed initially at 750 nm, and the band red-shifted as the growth process continued. This band was assigned to the dipole plasmon resonance of the gold nanoprisms and at the end of the growth process appeared in the NIR at about 1296 nm in conjunction with another band that appeared at 814 nm. The shift of the $\lambda_{max}$ may reflect an increase in nanoprism edge length. The assignment of this shift in dipole plasmon resonance as a function of time and concomitant increase in edge length is consistent with theoretical calculations and the isolation of the final nanoprism product. FIG. 2 also shows that after 30 minutes, the growth was essentially complete, as indicated by the fixed dipole plasmon resonances at 532 nm for the spherical particles and about 300 nm for the nanoprisms. These bands did not increase in intensity after this time, even after three months in the growth solution.

The nanoprisms were separated from the spherical nanoparticles using an aluminum oxide filter having a 100 nm pore size. When the nanoprisms were separated from the spherical particles, a broad band in the UV-Vis-NIR spectrum at 800 nm remained observable. This band was assigned to the in-plane quadrupole mode of the nanoprisms (see FIG. 3B), and assignment was based upon characterization of the prisms by electron microscopy and on DDA calculations, which predicted plasmon bands that match the experimental results.

Figure 3:
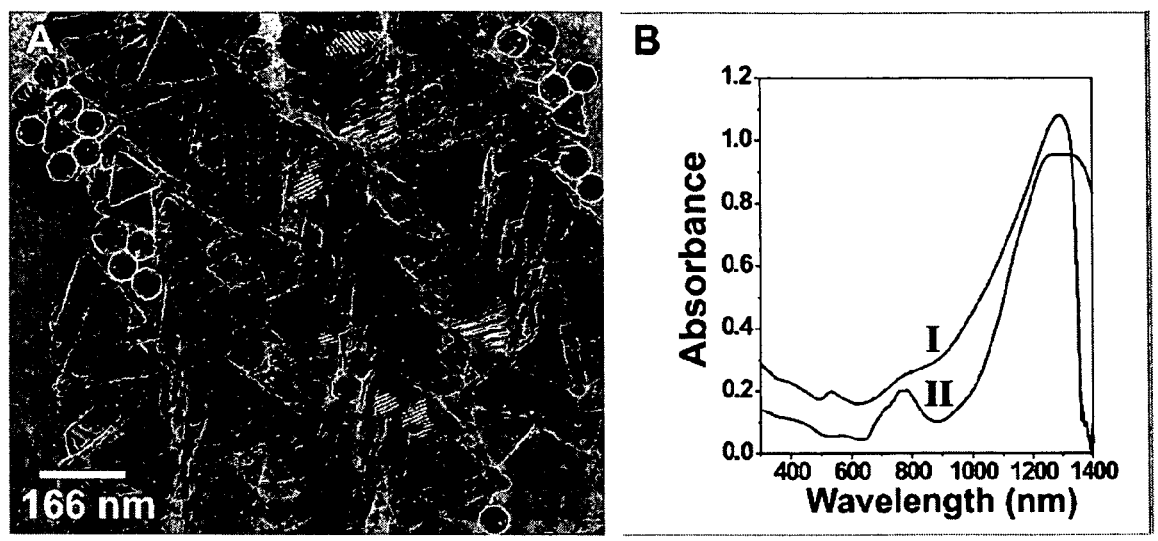
FIG. 3A is a TEM image of purified gold nanoprisms produced in accordance with the present method.
FIG. 3B is the corresponding UV-Vis-NIR spectra of the purified gold nanoprisms (I) and discrete dipole approximation (DDA) calculations of the same (II)
Figure 5:
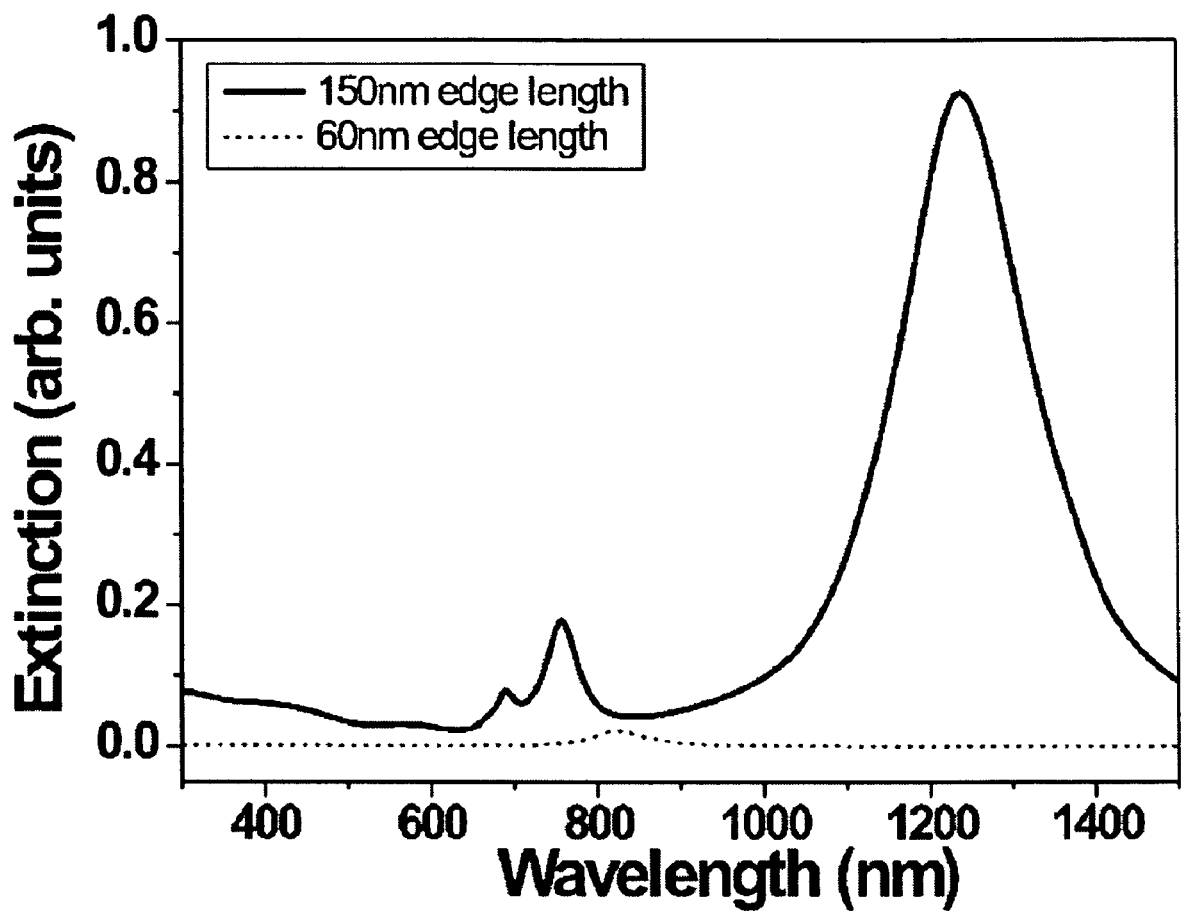
FIG. 5 contains a plot of extinction (arbitrary units) vs. wavelength (nm) showing the theoretical extinction spectra for prisms of varying edge length and 7.5 nm height, wherein the intensities have been scaled to represent the relative populations of a solution comprised of 15% small prisms (edge lengths about 60 nm) and 85% large prisms (edge lengths about 150 nm)

Significantly, a UV-Vis-NIR spectrum of the purified gold nanoprisms and a corresponding simulated spectrum obtained by DDA calculations are in excellent agreement (see FIG. 3B). An in-plane dipole band with $\lambda_{max} \approx 1300$ nm was observed in both spectra, as was a quadrupole band occurring at $\lambda_{max} \approx 800$ nm. The theoretical spectrum presented in trace II of FIG. 3B reflects the experimentally derived size distribution of gold nanoprisms in suspension. DDA calculations were performed on nanoprisms having a thickness of 7.5 nm and effective edge lengths of 90, 110, 130, 150, 170, 190, and 210 nm. The contribution of each of the prisms in the set then was weighted according to a Gaussian fit of the relative particle populations in solution like that shown in FIG. 1C. The weighted cross sections of these spectra were summed to form trace II of FIG. 3B. In the assignment of the quadrupole resonance, the possible contributions from nanoprisms of smaller edge lengths were considered. DDA calculations modeling relative populations of each prism length showed that the intensity of the quadrupole resonance from large prisms is much greater than the intensity of the dipole resonances of any remaining small edge length prisms in solution (FIG. 5). The asymmetry of the experimental dipole resonance peak at about 1300 nm was due to the truncation of the peak by the absorbance of water in the IR region. Additional calculations showed that the in-plane dipole resonance peak at about 1300 nm was quite sensitive to the physical dimensions of gold nanoprisms, in a similar fashion to silver nanoprisms. The in-plane quadrupole also was affected by those variations, but less sensitively. For example, the resonance bands (either of silver or gold) redshift with increases in edge length and sharpness, and decreases in thickness.

Gold nanoprisms prepared in accordance with the present method are of the most uniform structure and size distribution produced to date. The uniformity of these nanoprisms has allowed for characterization and study of their structures and physical and optical properties, including their quadrupole plasmon resonance properties, which previously could not be observed due to the inhomogeneity of and impurities in gold nanoprisms formed using prior methods. Because gold is much more stable than silver, the gold nanoprisms formed using the present method are expected to provide a route to synthesizing technologically useful materials presently unattainable from their less noble analogue, the silver nanoprisms. Such technologically useful materials include nanoparticle tags for biological sensing and detection, plasmon waveguides, and nanoelectronic interconnects.

Figure 7:
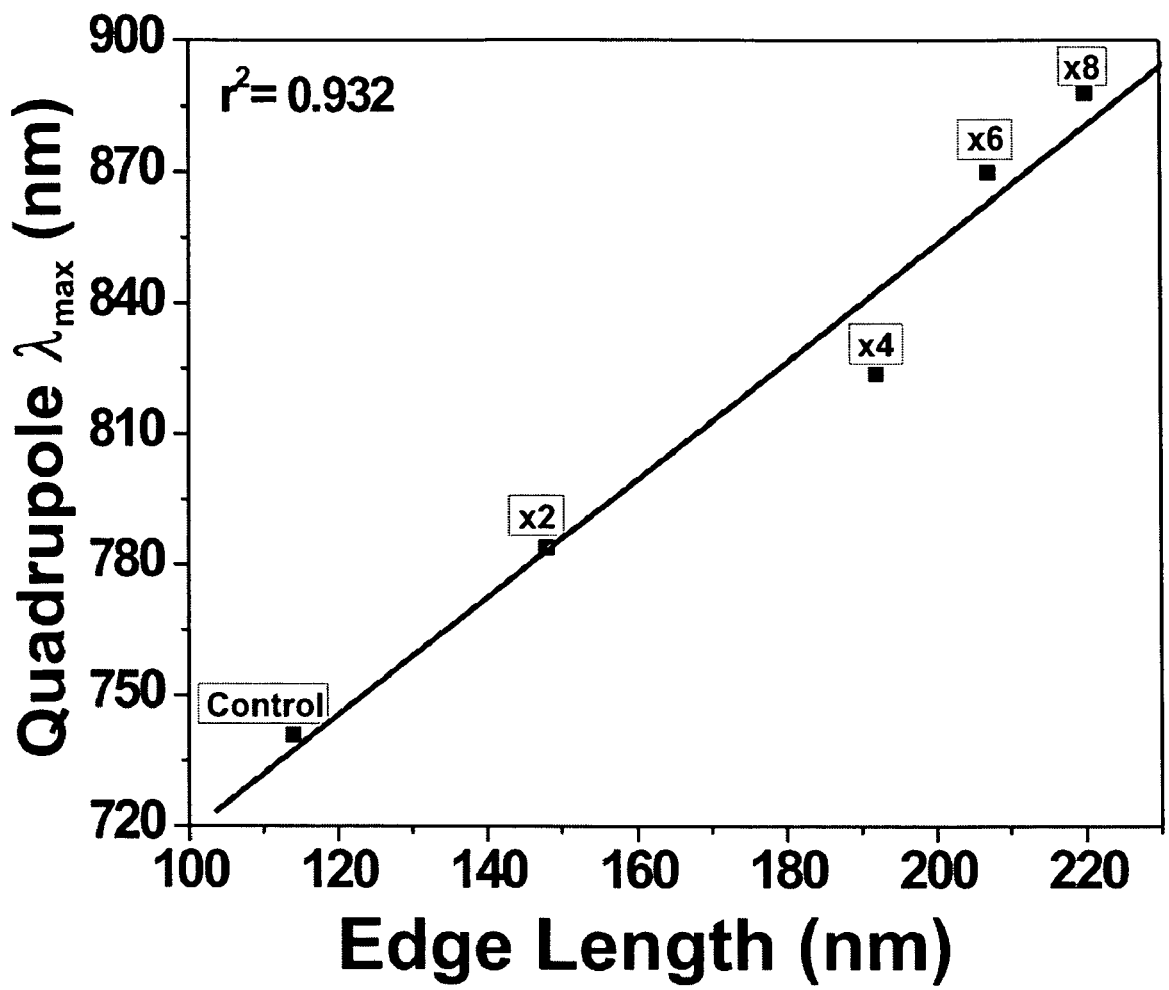
FIG. 7 is a plot of average nanoprism edge length (nm) vs. $\lambda_{max}$ of the corresponding quadrupole plasmon mode of the nanoprisms, wherein ×2 is two additions of a growth addition solution, ×4 is four additions, ×6 is six additions, and ×8 is eight additions.

In another aspect of the invention, the edge length growth of nanoprisms can be determined and/or monitored by measuring the quadrupole resonance peak at about 800 nm. In a step growth process of growing gold nanoprisms, it was observed that the intensity of the quadrupole resonance increases for every two additions of growth solution by about 0.0711 arbitrary units. Further, the $\lambda_{max}$ of the quadrupole resonance redshifts an average of about 33±5 nm with every two additions of growth solution (FIG. 7). These redshifts indicate that the nanoprisms are growing during these growth solution additions, and that the nanoprism shape is being maintained (Mosseri et al., *J Phys Chem*, 93:6791 (1989)). The observed intensity increases correlate to an expected increase in nanoprism extinction coefficient as nanoprism size increases.

Figure 8:
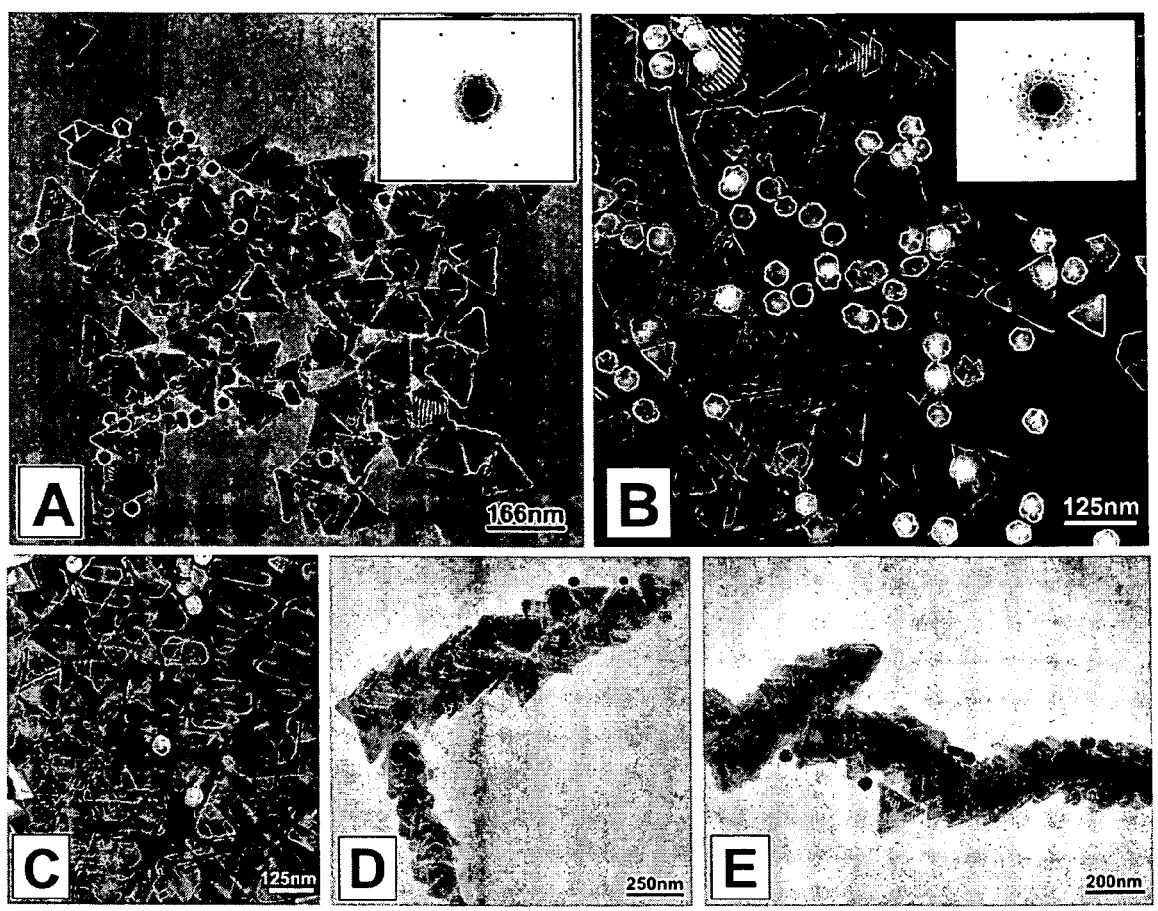
FIG. 8A is a TEM image of gold nanoprisms made without any additional growth (i.e., the control sample of FIG. 7) and the inset is the diffraction pattern of the gold nanoprism.
FIG. 8B is a TEM image of nanoprisms after 2 growth additions (×2) and the inset is the diffraction pattern of the gold nanoprism.
FIG. 8C is a TEM image of nanoprisms resulting from four growth additions (×4)
FIG. 8D is a TEM image of nanoprisms resulting from six growth additions (×6)
FIG. 8E is a TEM image of nanoprisms resulting from eight growth addition (×8)
Figure 9:
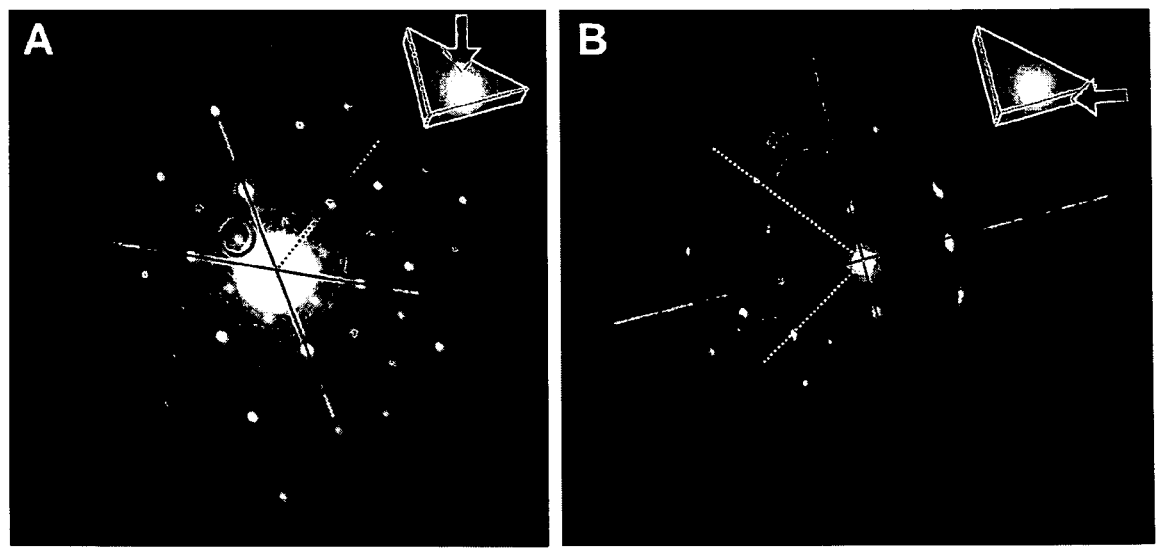
FIG. 9A is a diffraction pattern of a nanoprism face, wherein the hexagonal pattern is indicative of a <111> crystal surface.
FIG. 9B is a diffraction pattern of a nanoprism face, wherein the rectangular pattern is consistent with a <112> crystal surface of an fcc structure.
Figure 10:
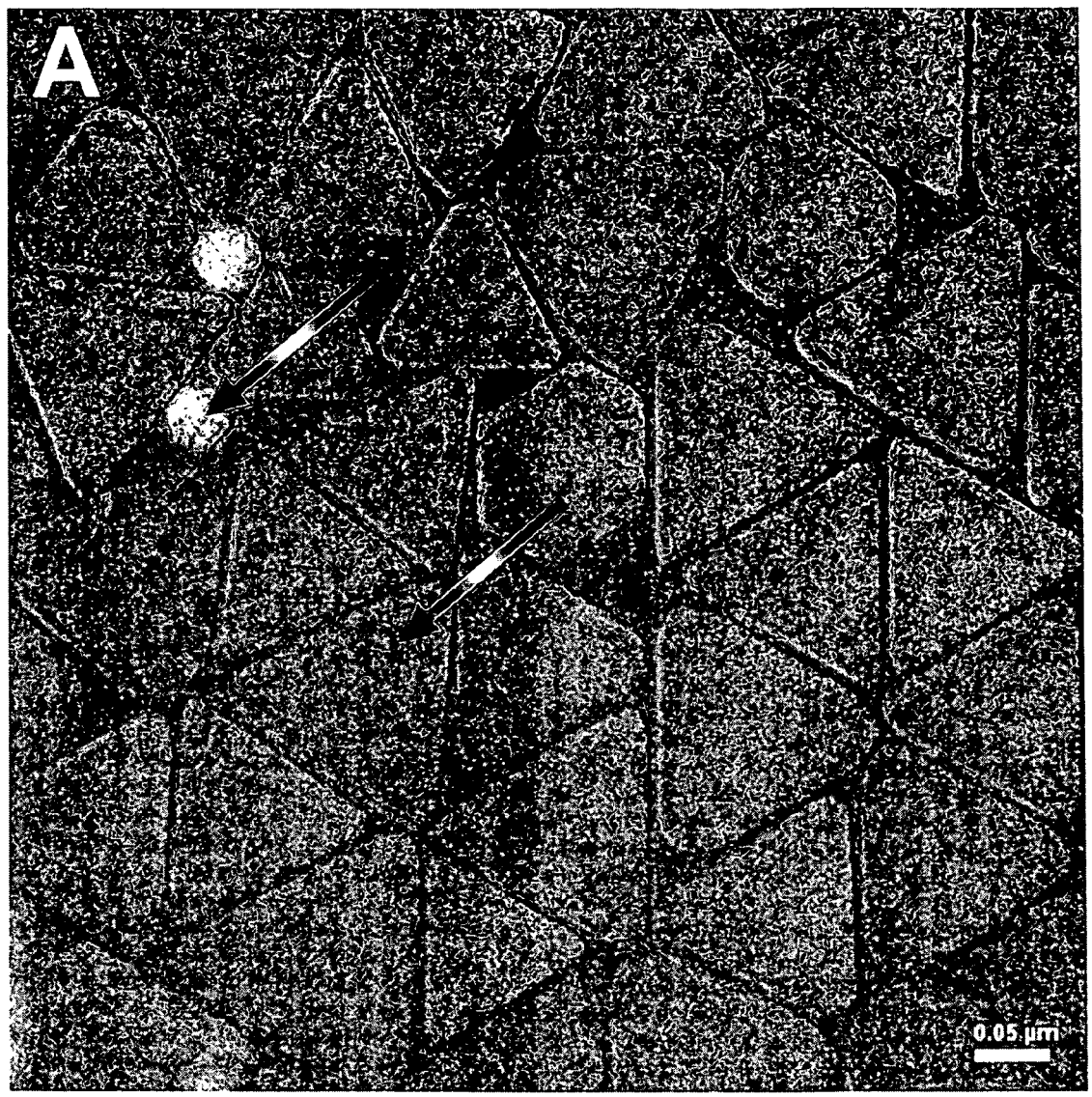
FIG. 10A is a high resolution TEM image of ×4 nanoprisms using electron energy loss spectroscopy (EELS) where contrast uniformity indicates thickness uniformity, and the arrows highlight the contrast between faceted and flat particles.
FIG. 10B is a TEM image of ×4 nanoprisms turned sideways showing prism thickness.
Figure 10:

TEM and statistical analyses confirm that the shift is indicative of a gradual increase in nanoprism edge length with a little change in nanoprism thickness, and no change in crystallinity (FIG. 8). The average edge length and thickness of nanoprisms formed are 114±15 nm and 7.5±0.5 nm, respectively (FIG. 8A). A diffraction pattern of the original nanoprisms show a hexagonal pattern that is characteristic of the <111> facet of a fcc packed crystal (FIG. 8A). The nanoprisms retain their triangular shape throughout the growing process, including edge smoothness and corner sharpness (FIG. 8B). A diffraction pattern of a single nanoprism also exhibits a distinct hexagonal pattern indicating a single crystalline <111> surface. The result demonstrates that the crystallinity of the nanoprisms does not change with increasing gold additions. The average nanoprisms edge lengths for two additional additions of growth solution (beyond the first three growth solutions), four additional additions, six additional additions, and eight additional additions are 148±20 nm, 192±30 nm, 207±19 nm, and 220±30 nm, respectively (FIG. 9). This gradual increase in average edge length correlates to the shifts in observed plasmon resonance as predicted by theory (Mosseri et al., *J Phys Chem*, 93:6791 (1989)). Additional TEM analysis of the samples indicated that the nanoprism thickness remains essentially constant throughout the growth process, and the nanoprism top and bottom faces are atomically flat as expected from a single gold crystal (FIG. 10). These observations support the correlation between measured nanoprism quadrupole resonance, both its $\lambda_{max}$ and its intensity, with its edge length.

A gold nanoprism sample of unknown edge length can be determined by monitoring the quadrupole resonance peak using UV-Vis-NIR and correlating the measured peak to a standard curve. A standard curve can be constructed by measuring the edge lengths of gold nanoprisms having different edge lengths using known techniques, such as TEM, and measuring each nanoprism's quadrupole resonance. Once a standard curve is constructed, the $\lambda_{max}$ of the quadrupole resonance of nanoprisms of unknown edge length can be used to determine edge length, e.g., see FIG. 7.

Additional aspects and details of the invention will be apparent from the following examples, which are intended to be illustrative rather than limiting.

EXAMPLES

In a typical preparation, all glassware was washed with aqua regia (3:1 volume ratio of hydrochloric acid to nitric acid), and rinsed with Nanopure water and ethanol. CTBA, $HAuCl_4$, sodium borohydride ($NaBH_4$), sodium hydroxide (NaOH), L-ascorbic acid, and trisodium citrate were obtained from Aldrich (Milwaukee, Wis. USA) and used as received.

Example 1

Growth of Nanoprisms Using a Three-Step Growth Process

Figure 4:
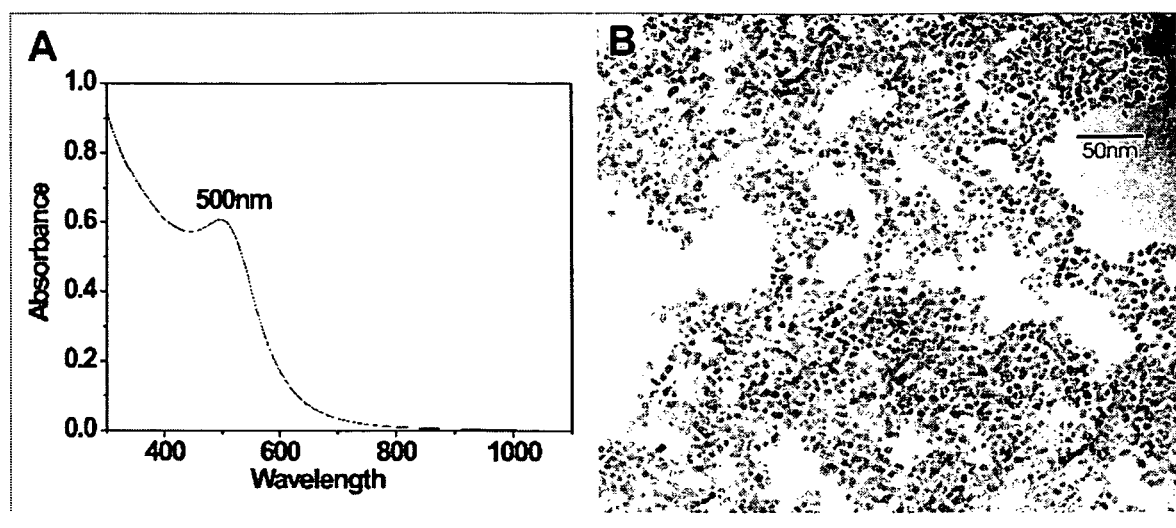
FIG. 4A is a UV-Vis spectrum for gold seed nanoparticles used in the present method.
FIG. 4B is the corresponding TEM image of the gold seed nanoparticles of FIG. 4A.

Gold nanoparticle seeds were prepared by reducing 1 mL of 10 mM $HAuCl_4$ using 1 mL of 100 mM $NaBH_4$ under vigorous stirring. The reduction was performed in the presence of 1 mL of 10 mM sodium citrate and 36 mL of fresh, Nanopure (18.1 MΩ) water. Upon addition of the $NaBH_4$ solution, the resulting solution turned a reddish orange color, and stirring was continued for one minute. The resulting mixture was aged for 2 to 4 hours to allow unreacted $NaBH_4$ to hydrolyze. The gold nanoparticle seeds exhibited a plasmon resonance peak at 500 nm, and had an average diameter of 5.2±0.6 nm (see FIG. 4B).

Three growth solutions were used in the seed-mediated growth process. The first and second solutions contained 0.25 mL of 10 mM $HAuCl_4$, 0.05 mL of 100 mM NaOH, 0.05 mL of 100 mM ascorbic acid, and 9 mL of a saturated CTAB solution. The third growth solution contained 2.5 mL of 10 mM $HAuCl_4$, 0.50 mL of 100 mM NaOH, 0.5 mL of 100 mM ascorbic acid, and 90 mL of a saturated CTAB solution. Prism formation was initiated by adding 1 mL of the gold seed nanoparticle suspension to the first growth solution. After sufficient aging time, 1 mL of the resulting first mixture then was added to the second growth solution, and the resulting second mixture, after sufficient aging time, was added in its entirety to the third growth solution to form a third mixture. After the addition, the color of the third mixture changed from clear to deep magenta-purple over a period of 30 minutes.

The seed mediated growth of the nanoprisms was characterized throughput the process by UV-Vis-NIR spectroscopy using a Cary 500 spectrophotometer (FIG. 2). All nanostructures were characterized using a Hitachi-8100 transmission electron microscope (TEM) at 200 kV.

Separation of the nanoprisms by filtration was conducted using an aluminum oxide filter having 100 nm pores (Whatman, Florham Park, N.J. USA). The filter was used to separate an original reaction mixture of gold nanoprisms by filtering particles smaller than 100 nm which include the spherical gold particles and smaller gold prisms seen in this synthesis. After filtration, the retentate was collected by sonicating the used alumina oxide filter in 1 mL of Nanopure water for 20 seconds. The aluminum oxide filter was removed from the solution, and the resulting aqueous mixture contained the filtered sample of gold nanoprisms. This mixture was characterized by UV-Vis-NIR spectroscopy and TEM.

The calculated spectrum (see FIG. 3B, trace II) is based upon gold dielectric constants taken from the literature (Lynch et al., *Handbook of Optical Constants of Solids*, ed. Palik, E.D., (New York: Academic Press) p 275 (1985)). In particular, the tabulated values from Theye (*Phys Chem B* 2:3060 (1970)) were used to generate the calculated spectrum. The spectrum present in trace II of FIG. 3B reflects a weighted average of prism edge lengths, the distribution of which was derived from experimentally determined histograms of effective triangle edge length, e.g., FIG 1C. The spectrum also reflects the real shape of the triangular nanoprisms in solution, rather than a perfect prism shape approximation. The experimentally derived nanoprisms have slightly rounded edges, also called "snipped" edges. In all calculations, then, the edges of the theoretical nanoprisms have been "snipped" in order to accurately represent the particles in solution. In each prism calculation, 25 nm has been removed from each point, giving an effective edge length that is 50 nm shorter than the corresponding perfect prism.

FIG. 3B, trace I shows the experimental spectrum from a solution of separated prisms. The spherical particle peak's absorbance at $\lambda_{max}$=532 nm decreased by about 95% from the peak's absorbance in the spectrum taken from the original, unfiltered solution (see FIG. 2). If the peak at around 800 nm was from smaller triangles (edge length <100 nm), one would expect to see a decrease of similar magnitude in this peak as well. However, that is not observed (see FIG. 3B).

Additionally, the peak at around 800 nm was assigned to the quadrupole resonance of large gold prisms based on multiple DDA calculations that show how the relative intensities of the dipole and quadrupole modes depend on edge lengths. These spectra indicate that as the edge length of the gold nanoprism decreases, its dipole resonance blueshifts and decreases in intensity. In order to determine whether the peak at ~800 nm was from the dipole resonance of these smaller prisms or from the quadrupole resonance of the larger prisms, the spectra of gold nanoprisms with effective edge lengths of 60 nm and 150 nm were compared (see FIG. 5). This simplistic representation of two particle sizes was sufficient to illustrate the significant differences in relative peak intensity. The prism particle cross sections were weighted to reflect their populations in solution before any filtration or purification. The intensity of the quadrupole resonance from the larger prisms dwarfed possible contributions from the dipole resonances of smaller nanoprisms. The intensity from the smaller prisms relative to the intensity of larger prisms (under these "worst case" conditions) shows that it is unlikely for small prisms to contribute significantly to the peaks observed in the experimental spectra (FIG. 2 and FIG. 3B). In addition, it was found that including the smaller prisms in the accurately weighted spectrum (FIG. 3B) did not alter the results. This again is attributed to the relatively small cross sections of small particles and the extremely small weighting coefficient produced from the Gaussian fit.

Figure 6:
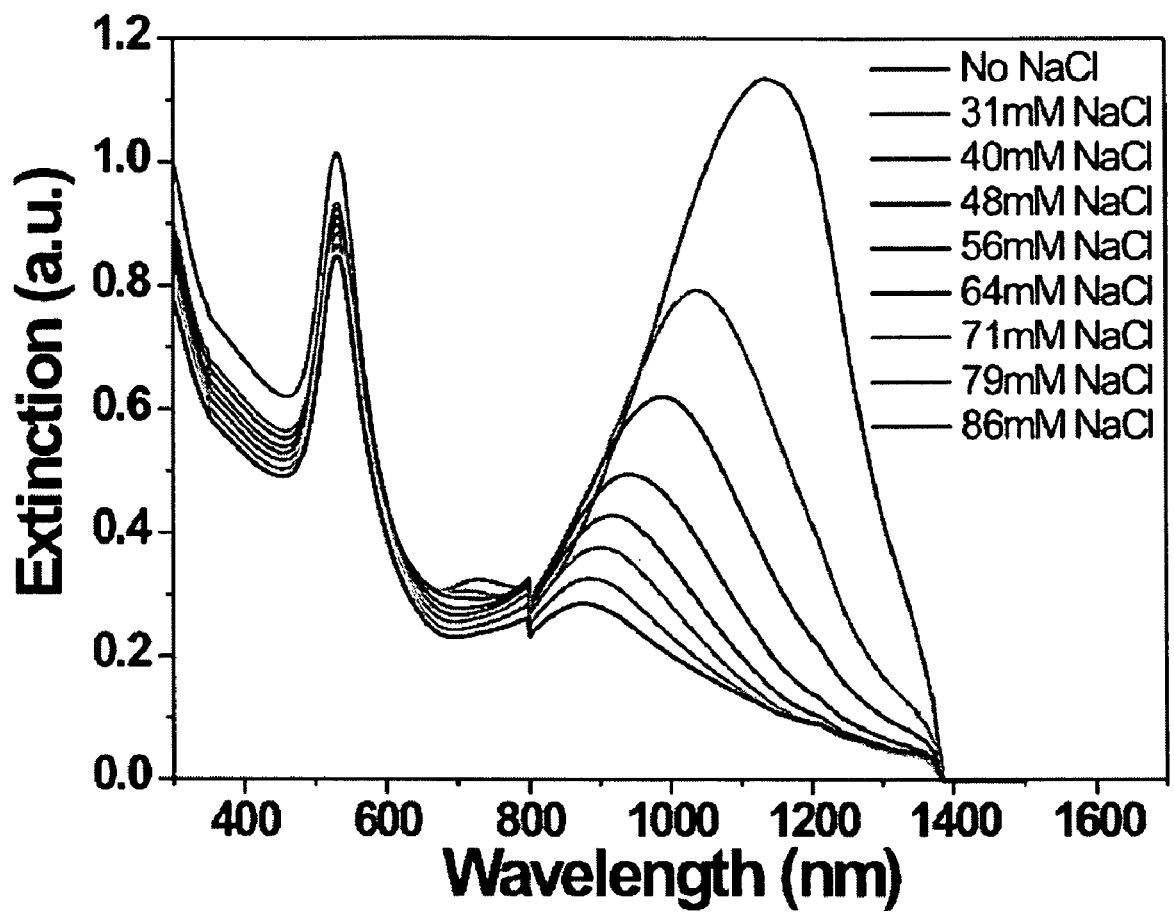
FIG. 6 contains a plot of extinction vs. wavelength (nm) of the UV-Vis-NIR spectra of gold nanoprisms during aggregation by slow addition of various concentrations of sodium chloride, wherein an increase in sodium chloride concentration corresponds to a decrease in extinction.

In analyzing the optical properties of the nanoprism suspension, the presence of smaller edge length nanoprisms and the real prism size distribution in solution were considered. In addition to these parameters, the possible contribution of particle aggregation to the optical spectrum also was considered. In FIG. 6, the UV-Vis-NIR spectrum of a solution of gold is shown as it undergoes aggregation by increasing salt concentration. Induction of aggregation of the nanoprisms was also attempted in order to determine if the origin of the around 800 nm peak was from a distribution of aggregated particles. During the aggregation process, there was a continuous decrease in the dipole peak intensity and a concomitant decrease in the quadrupole peak intensity which further indicated that the two peaks are correlated. If the peak around 800 nm was from a suspended aggregate, one would expect to see an increase in the intensity of the 800 nm peak as aggregation in the solution increased. The absence of this peak increase further confirms that the peak at around 800 nm is the quadrupole resonance of gold nanoprisms.

Example 2

Growth of Larger Gold Nanoprisms

The nanoprisms produced in Example 1 were subjected to further additions of gold salt and reducing agent.

A solution of 10 mL nanoprisms synthesized in Example 1 were mixed with 50 μL of a 0.01 M solution HAuCl$_4$ and 50 μL of a 0.1M solution ascorbic acid. This addition increased the gold ion concentration by 20%, while only increasing the total volume of the reaction mixture by less than 0.5%. Ascorbic acid was added as a ten fold excess relative to the added gold ion. The mixture was agitated gently via shaking. This mixture was labeled as one "growth addition," and abbreviated ×1. Other growth additions were labeled ×2, ×3, ×4, etc, such that a growth addition of ×3 indicates a total addition of 150 μL of a 0.01M solution HAuCl$_4$ and 150 μL of a 0.1M solution ascorbic acid. The nanoprisms were monitored via UV-Vis-NIR for quadrupole resonance peaks. The peak intensity and $\lambda_{max}$ were mapped against measured edge length (FIG. 7). No less than one minute and up to 2 months later, another addition of a growth addition can be added to further grow the nanoprisms.

The foregoing describes and exemplifies the invention but is not intended to limit the invention defined by the claims which follow. All of the methods disclosed and claimed herein can be made and executed without undue experimentation in light of the present disclosure. While the materials and methods of this invention have been described in terms of specific embodiments, it will be apparent to those of skill in the art that variations may be applied to the materials and/or methods and in the steps or in the sequence of steps of the methods described herein without departing from the concept, spirit and scope of the invention. More specifically, it will be apparent that certain agents which are both chemically and physiologically related may be substituted for the agents described herein while the same or similar results would be achieved. All such similar substitutes and modifications apparent to those of ordinary skill in the art are deemed to be within the spirit, scope and concept of the invention as defined by the appended claims.

What is claimed:

1. A method of producing gold nanoprisms comprising the steps of
    a) admixing a suspension of gold seed nanoparticles and a first growth solution to form a first mixture,
        wherein the volume ratio of first growth solution to suspension is at least 2:1,
        wherein the gold seed nanoparticles have a diameter of about 3 to about 10 nm, and
        wherein the first growth solution comprises a gold salt, a base, a reducing agent, and a surfactant, wherein the surfactant has a concentration in the first growth solution of at least 50% saturation at about 25° C.;
    b) admixing the first mixture and a second growth solution to form a second mixture,
        wherein the volume ratio of second growth solution to first mixture is at least 2:1,
        wherein the second growth solution comprises a gold salt, a base, a reducing agent, and a surfactant, wherein the surfactant has a concentration in the second growth solution of at least 80% saturation at about 25° C.; and
    c) admixing the second mixture and a third growth solution to form a third mixture,
        wherein the volume ratio of third growth solution to second mixture is at least 2:1, and
        wherein the third growth solution comprises a gold salt, a base, a reducing agent, and a surfactant, and wherein the surfactant has a concentration in the third growth solution of at least 80% saturation at about 25° C.;
    wherein the surfactants of the first, second, and third growth solutions are ammonium salts having at least one and up to four substituents having at least four carbons; and
    wherein the gold nanoprisms are triangular or a combination of triangular and spherical and are essentially free of rods, cubes, and branched structures, and the triangular nanoprisms have at least one edge length of about 100 to about 400 nm.

2. The method of claim 1 wherein the gold nanoprisms are triangular.

3. The method of claim 1 wherein the gold salt of one or more of the first growth solution, second growth solution, or third growth solution comprises HAuCl$_4$ or a potassium, calcium, sodium, or lithium salt thereof.

4. The method of claim 1 wherein the reducing agent of the first growth solution, second growth solution, and third growth solution, independently, is selected from the group consisting of ascorbic acid, sodium borohydride, 2-mercaptoethanol, dithiothreitol, hydrazine, lithium aluminum hydride, diisobutylalum mum hydride, oxalic acid, and Lindlar catalyst.

5. The method of claim 1 wherein the reducing agent of the first growth solution, second growth solution, and third growth solution comprises ascorbic acid.

6. The method of claim 1 wherein the surfactant of the first growth solution, second growth solution, and third growth solution, independently, is selected from the group consisting of tetrabutylammonium bromide, dodecyldimethylamonium bromide, cetyltrimethylammonium bromide, and mixtures thereof.

7. The method of claim 1 wherein the surfactant of the first growth solution, second growth solution, and third growth solution comprises cetyltrimethylammonium bromide.

8. The method of claim 1 wherein the first growth solution and the second growth solution comprise an identical gold salt, an identical reducing agent, and an identical surfactant.

9. The method of claim 1 wherein the first growth solution, the second growth solution, and the third growth solution comprise an identical gold salt, an identical reducing agent, and an identical surfactant.

10. The method of claim 9 wherein the gold salt comprises HAuCl$_4$ or a potassium, calcium, sodium, or lithium salt thereof.

11. The method of claim 9 wherein the reducing agent comprises ascorbic acid.

12. The method of claim 9 wherein the surfactant comprises cetyltrimethylammonium bromide.

13. The method of claim 1 further comprising filtering the third mixture.

14. The method of claim 1 wherein the gold nanoprisms are single crystalline.

15. The method of claim 1 wherein the concentration of the surfactant in one or more of the first growth solution, second growth solution, or third growth solution is at least 90% saturated at about 25° C.

16. A method of producing gold nanoprisms comprising a) admixing a suspension of gold seed nanoparticles and a first growth solution to form a first mixture, wherein the gold seed nanoparticles have a diameter of about 3 to about 10 nm, wherein the volume ratio of first growth to suspension solution is at least 2:1, and the first growth solution comprises:

$HAuCl_4$ or a potassium, calcium, sodium, or lithium salt thereof; sodium hydroxide; ascorbic acid; and cetyltrimethylammonium bromide, wherein the cetyltrimethylammonium bromide has a concentration in the first growth solution of at least 80% saturation at about 25° C.;

b) admixing the first mixture and a second growth solution to form a second mixture, wherein the volume ratio of second growth solution to first mixture is at least 2:1 and wherein the second growth solution comprises:

$HAuCl_4$ or a potassium, calcium, sodium, or lithium salt thereof; sodium hydroxide; ascorbic acid; and cetyltrimethylammonium bromide, wherein the cetyltrimethylammonium bromide has a concentration in the second growth solution of at least 80% saturation at about 25° C.; and c) admixing the second mixture and a third growth solution to form a third mixture, wherein the volume ratio of third growth solution to second mixture is at least 2:1 and wherein the third growth solution comprises:

$HAuCl_4$ or a potassium, calcium, sodium, or lithium salt thereof; sodium hydroxide; ascorbic acid; and cetyltrimethylammonium bromide, wherein the cetyltrimethylammonium bromide has a concentration in the third growth solution of at least 80% saturation at about 25° C., and wherein the gold nanoprisms are triangular or a combination of triangular and spherical and are essentially free of rods, cubes, and branched structures, and the triangular nanoprisms have at least one edge length of about 100 to about 400 nm.

* * * * *

UNITED STATES PATENT AND TRADEMARK OFFICE
CERTIFICATE OF CORRECTION

PATENT NO. : 7,588,624 B2
APPLICATION NO. : 11/372687
DATED : September 15, 2009
INVENTOR(S) : Chad A. Mirkin et al.

It is certified that error appears in the above-identified patent and that said Letters Patent is hereby corrected as shown below:

In the Claims:

At Column 12, line 34, "diisobutylalum mum" should be -- diisobutylaluminum --.

Signed and Sealed this

Fourth Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,588,624 B2  Page 1 of 1
APPLICATION NO. : 11/372687
DATED : September 15, 2009
INVENTOR(S) : Mirkin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 411 days.

Signed and Sealed this

Twenty-first Day of September, 2010

David J. Kappos
*Director of the United States Patent and Trademark Office*